United States Patent
Choi et al.

(10) Patent No.: US 9,455,694 B2
(45) Date of Patent: Sep. 27, 2016

(54) DATA TRANSMISSION CIRCUIT

(71) Applicant: SK hynix Inc., Gyeonggi-do (KR)

(72) Inventors: Jin-Woo Choi, Gyeonggi-do (KR); Dong-Wook Jang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/798,203

(22) Filed: Jul. 13, 2015

(65) Prior Publication Data

US 2016/0254805 A1  Sep. 1, 2016

(30) Foreign Application Priority Data

Feb. 27, 2015 (KR) .................. 10-2015-0027954

(51) Int. Cl.
*H03K 3/00* (2006.01)
*H03K 5/135* (2006.01)
*H03K 3/027* (2006.01)
*H03K 5/00* (2006.01)

(52) U.S. Cl.
CPC .............. *H03K 5/135* (2013.01); *H03K 3/027* (2013.01); *H03K 2005/00013* (2013.01)

(58) Field of Classification Search
CPC ................. H03K 5/135; H03K 3/027; H03K 2005/00013

USPC ......................................................... 327/108
See application file for complete search history.

(56) References Cited

U.S. PATENT DOCUMENTS

| 6,704,818 | B1 * | 3/2004 | Martin | H03K 17/164 710/100 |
| 7,358,774 | B2 * | 4/2008 | Kim | H04L 25/0272 326/86 |
| 8,315,303 | B1 * | 11/2012 | Chana | H04L 25/03343 332/109 |
| 8,467,437 | B2 | 6/2013 | Zerbe et al. | |

* cited by examiner

Primary Examiner — Kenneth B Wells
(74) Attorney, Agent, or Firm — IP & T Group LLP

(57) ABSTRACT

A data transmission circuit includes a first data selection unit suitable for alternately outputting data of first and second input lines as first driving data in synchronization with a clock; a data delay unit suitable for generating first and second delay data by delaying the data of the first and second input lines in synchronization with the clock; a second data selection unit suitable for: alternately outputting the data of the first and second input lines as second driving data in synchronization with the clock during a first mode, and alternately outputting inverted first and second delay data, which are inverted from the first and second delay data, as the second driving data in synchronization with the clock during a second mode; a first driving unit suitable for driving an output line in response to the first driving data; and a second driving unit suitable for driving the output line in response to the second driving data.

24 Claims, 9 Drawing Sheets

DATA TRANSMISSION CIRCUIT

CROSS-REFERENCE TO RELATED APPLICATIONS

The present application claims priority of Korean Patent Application No, 10-2015-0027954, filed on Feb. 27, 2015, which is incorporated herein by reference in its entirety.

BACKGROUND

1. Field

Exemplary embodiments of the present invention relate to a data transmission circuit.

2. Description of the Related Art

In general, semiconductor memory devices, such as dynamic random access memory (DRAM), include data transmission circuits for outputting data. Furthermore high-speed data transmission circuits for outputting data at giga-bit per second (Gbps) speeds adopt methods of data emphasis to reduce inter symbol integrity (ISI) jitter. A data emphasis method is described below.

FIG. 1 is a schematic diagram illustrating gains of a data transmission circuit 110, a transmission line 120, and a data output circuit 130 without data emphasis (the case "(a)") and with data emphasis (the case "(b)").

As illustrated in FIG. 1, the data transmission line 120 has a low pass filter characteristic Tx_Line due to parasitic resistance R and parasitic capacitance C. Accordingly, without data emphasis, input data DATA_IN transmitted by the data transmission circuit 110 is distorted. The data output circuit 130 outputs output data DATA_OUT in which the gain of a high frequency part has a low level.

According to the data emphasis, the transmission circuit 110 emphasizes a high frequency component of the input data DATA_IN by taking signal distortion into consideration and transmitting the input data DATA_IN. Case "(b)" shows that the transmission circuit 110 emphasizes the high frequency component of the input data DATA_IN and outputs the output data DATA_OUT in which the gain of the high frequency part has the original level. That is, although the transmission line 120 has a low pass filter characteristic Tx_Line, the data output circuit 130 may receive signals having the same gain FIG. 2 is a waveform illustrating data according to data emphasis in a conventional data transmission circuit.

As illustrated in FIG. 2, according to the data emphasis, the data DATA is emphasized when the level of the data shifts. When the level of the data DATA shifts from a logic "low" to a logic "high", the "high" level is emphasized for a predetermined time. When the level of the data DATA shifts from a logic "high" to a logic "low", the "low" level is also emphasized. The high frequency component of the data DATA is concentrated at the shifting point of the data DATA level, and thus the level of data DATA is emphasized on the high frequency component when the level of the data DATA shifts.

As illustrated in FIG. 2, when the data DATA shifts, the level of the data DATA is emphasized for a single unit interval (UI) of the data DATA.

SUMMARY

Various embodiments are directed to a data transmission circuit capable of emphasizing data to a predetermined level depending on an emphasis mode when data is transmitted, and reducing skew between signals combined for the data emphasis.

In an embodiment, a data transmission circuit may include a first data selection unit suitable for alternately outputting data of first and second input lines as first driving data in synchronization with a clock; a data delay unit suitable for generating first and second delay data by delaying the data of the first and second input lines in synchronization with the clock; a second data selection unit suitable for alternately outputting the data of the first and second input lines as second driving data in synchronization with the clock during a first mode, and alternately outputting inverted first and second delay data, which are inverted from the first and second delay data, as the second driving data in synchronization with the clock during a second mode; a first driving unit suitable for driving an output line in response to the first driving data; and a second driving unit suitable for driving the output line in response to the second driving data.

In an embodiment a data transmission circuit may include a first data selection unit suitable for alternately outputting data of first and second input lines as first pull-up driving data in synchronization with a clock, and alternately outputting inverted first and second data, which are inverted from the data of the first and second input lines, as first pull-down driving data in synchronization with the clock; a data delay unit suitable for: generating first and second delay data by delaying the data of the first and second input lines in synchronization with the clock, and generating inverted first and second delay data by inverting the first and second delay data in synchronization with the clock; a second data selection unit suitable for: during a first mode, alternately outputting the data of the first and second input lines as second pull-up driving data and alternately outputting the inverted first and second data as second pull-down driving data, in synchronization with the clock, and during a second mode, alternately outputting the inverted first and second delay data as the second pull-up driving data and alternately outputting the first and second delay data as the second pull-down driving data, in synchronization with the clock; a first driving unit suitable for performing pull-up driving on an output line in response to the first pull-up driving data and performing pull-down driving on the output line in response to the second pull-down driving data; and a second driving unit suitable for performing pull-up driving on the output line in response to the second pull-up driving data and performing pull-down driving on the output line in response to the second pull-down driving data.

DETAILED DESCRIPTION

Figure 1:
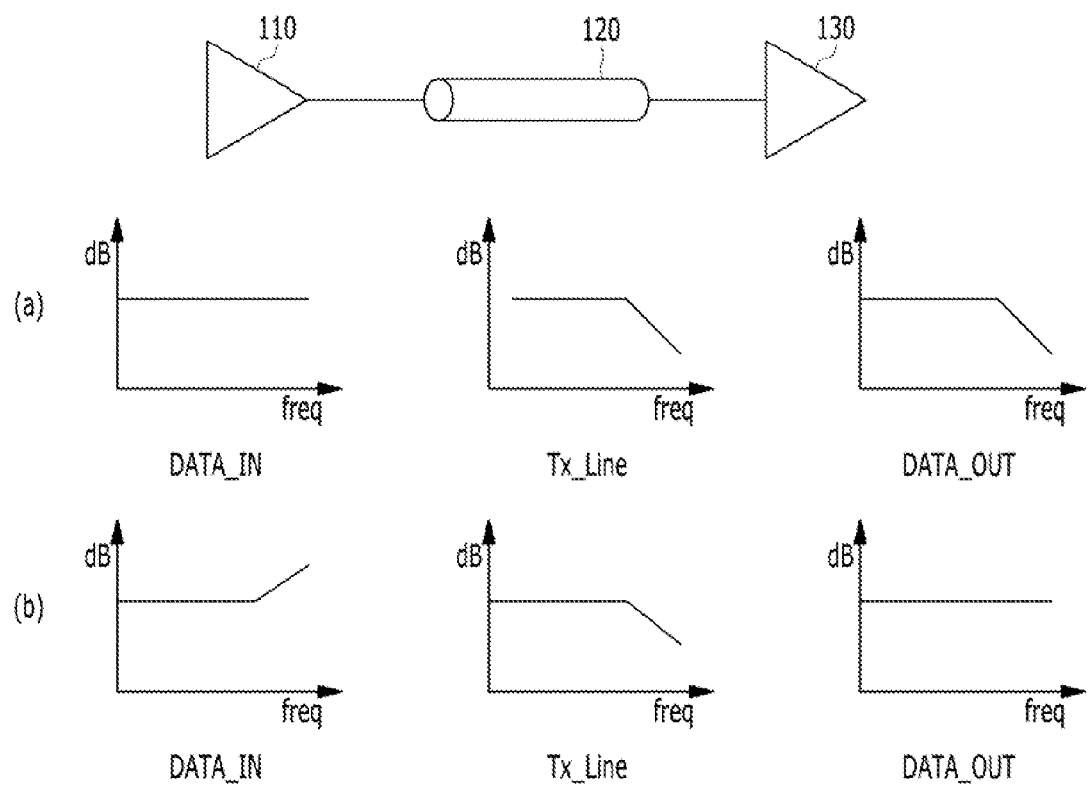
FIG. 1 is a schematic diagram illustrating gains of a data transmission circuit, a transmission line, and a data transmission circuit.
Figure 2:
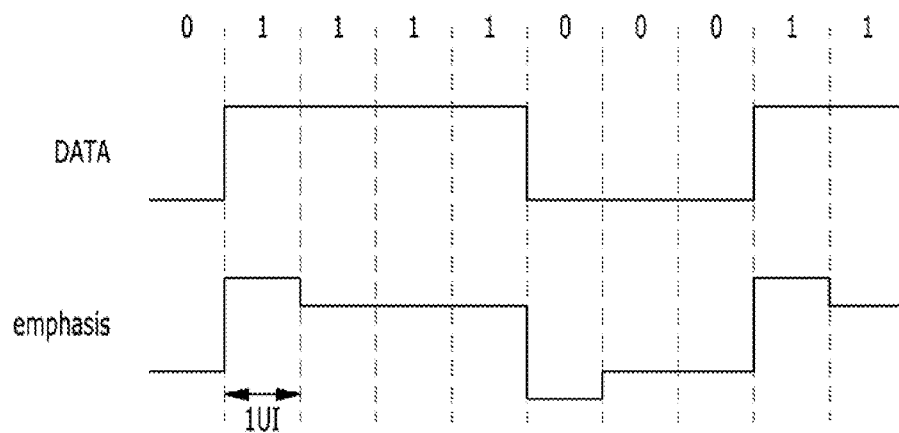
FIG. 2 is a waveform illustrating data according to data emphasis in a conventional data transmission circuit.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
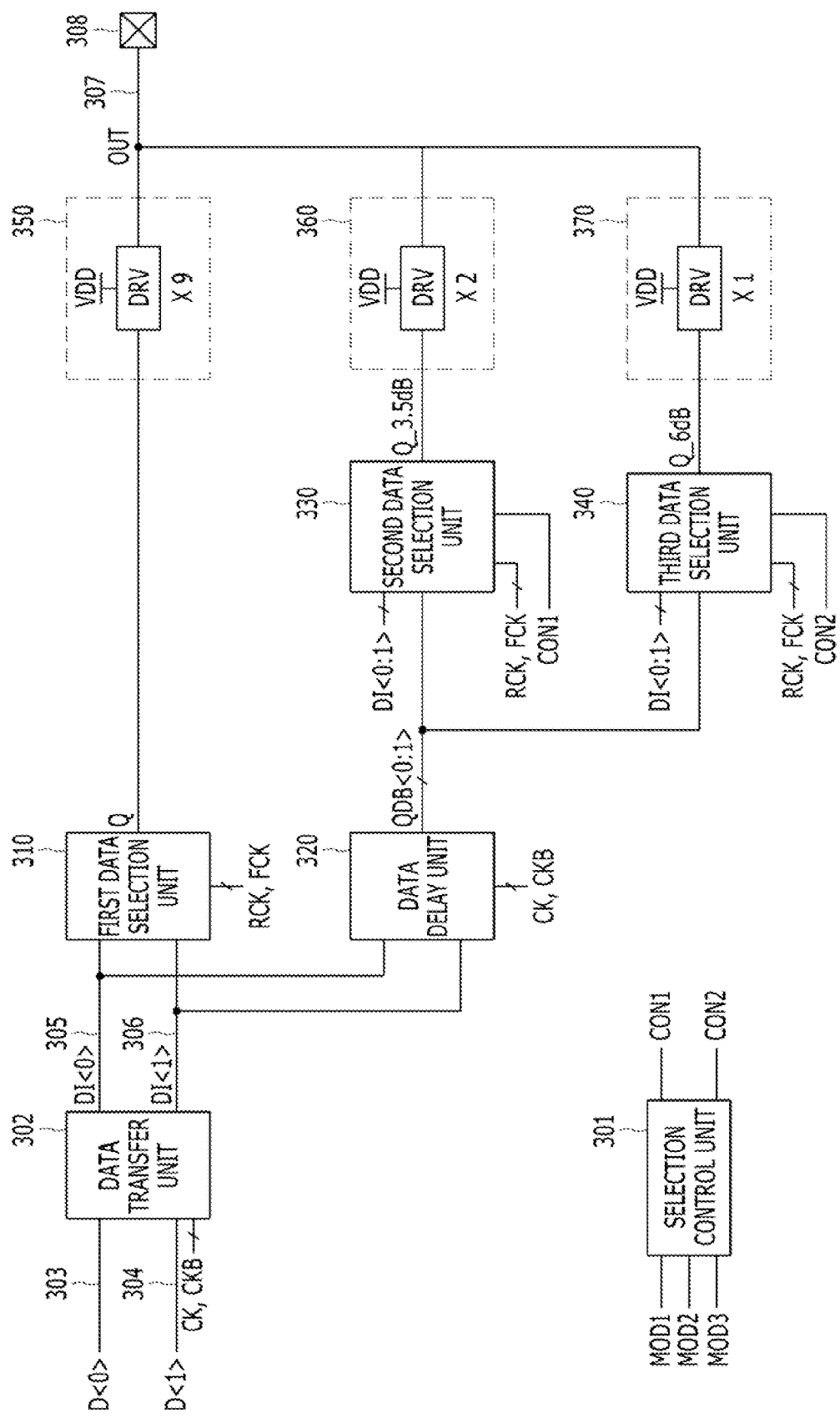
FIG. 3 is a block diagram illustrating a data transmission circuit in accordance with an embodiment of the present invention.

FIG. 3 is a block diagram illustrating a data transmission circuit in accordance with an embodiment of the present invention.

Referring to FIG. 3, the data transmission circuit may include a first data selection unit 310, a data delay unit 320, a second data selection unit 330, a third data selection unit 340, first to third driving units 350 to 370, a selection control unit 301, a data transfer unit 302, first and second internal data lines 303 and 304, first and second input lines 305 and 306, an output line 307, and an output pad 308.

The selection control unit 301 may output control signals CON1 and CON2 for controlling the first and second data selection units 310 and 330 depending on a mode selected from first to third modes MODE1, MODE2 and MODE 3. The selection control unit 301 may output the control signals CON1 and CON2 having low levels during the first mode MOD1, may output the control signal CON1 having a high level and the control signal CON2 having a low level during the second mode MOD2, and may output the control signals CON1 and CON2 having high levels during the third mode MOD3. During the first mode, data may not be emphasized. During the second mode, data may be emphasized by –3.5 dB. During the third mode, data may be emphasized by –6 dB. During the second mode, an un-emphasized level may be 3.5 dB lower than the emphasized level. During the third mode, the un-emphasized level may be 6 dB lower than the emphasized level.

The first and second internal data lines 303 and 304 may internally transfer data D<0:1> in a semiconductor device including the data transmission circuit. Each of the data D<0:1> of the first and second internal data lines 303 and 304 may have a unit interval (UI) corresponding to a single cycle of a reference clock CK, and the data D<0:1> may have the same phase. The UI may represent the width of 1-bit data.

The data transfer unit 302 may transfer the data D<0:1> on the first and second internal data lines 303 and 304 to the first and second input lines 305 and 306, respectively. The data transfer unit 302 may delay the data D<0> of the first internal data line 303 by half of a clock cycle and output the delayed data DI<0> to the first input line 305. Furthermore, the data transfer unit 302 may delay the data D<1> of the second internal data line 304 by 1 clock and output the delayed data DI<1> to the second input line 306. Accordingly, the delayed data DI<0:1> of the first and second input lines 305 and 306 may have the UI of the single cycle of the reference clock CK and have a phase difference half of deck cycle of the reference clock CK.

The first data selection unit 310 may alternately output the data DI<0:1> of the first and second input lines 305 and 306 as first driving data Q. The first data selection unit 310 may output the data DI<0> of the first input line 305 as the first driving data Q at a high level of a first clock RCK, and output the data DI<1> of the second input line 306 as the first driving data Q at a high level of a second clock FCK. The first clock RCK may have the same phase and cycle as the reference clock CK, and the second clock FCK may have the opposite phase and the same cycle as the reference clock CK. That is, the first data selection unit 310 may output the data DI 0> as the first driving data at a high level of the reference clock CK and output the data DI<1> as the first driving data Q at a low level of the reference clock CK. The operation of the first data selection unit 310 may be synchronized with the reference clock CK.

The data delay unit 320 may delay the data DI<0:1> of the first and second input lines 305 and 306 and generate the first and second delay data QD<0:1>. The data delay unit 320 may delay the data DI<0:1> for 1 UI and output the first and second delay data QD<0:1>. The 1 UI of the data DI<0>, DI<1> is the single cycle of the reference clock CK. Thus, the data delay unit 320 may delay each of the data DI<0> and DI<1> by 1 clock and output each of the first delay data QD<0> and QD<1>. The data delay unit 320 may output inverted first and second delay data QDB<0:1> inverted from the first and second delay data QD<0:1>. The operation of the data delay unit 320 may be synchronized with the reference clock CK.

The second data selection unit 330 may alternately output the data DI<0:1> of the first and second input lines 305 and 305 as second driving data Q_3.5 dB during the first mode MOD1 when the control signal CON1 has a low level. The second data selection unit 330 may alternately output the inverted first and second delay data QDB<0:1> as the second driving data Q_3.5 dB during the second or third mode when the control signal CON1 has a high level. The operation of the second data selection unit 330 may be synchronized with the reference clock CK.

During the first mode, the second data selection unit 330 may output the data DI<0> of the first input line 305 as the second driving data Q_3.5 dB at a high level of the first clock RCK. Furthermore, during the first mode, the second data selection unit 330 may output the data DI<1> of the second input line 306 as the second driving data Q_3.5 dB at a high level of the second clock FCK. During the second or third mode, the second data selection unit 330 may output the inverted second delay data QDB<1> as the second driving data Q_3.5 dB at a high level of the first clock RCK. Furthermore, during the second or third mode, the second data selection unit 330 may output the inverted first delay data QDB<0> as the second driving data Q_3.5 dB at a high level of the second clock FCK.

The third data selection unit 340 may alternately output the data DI<0:1> of the first and second input lines 305 and 306 as third driving data Q_6 dB during the first or second mode when the control signal CON2 has a low level. The third data selection unit 340 may alternately output the inverted first and second delay data QDB<0:1> as the third driving data Q_6 dB during the third mode when the control signal CON2 has a high level. The operation of the third data selection unit 340 may be synchronized with the reference clock CK.

During the first or second mode, the third data selection unit 340 may output the data DI<0> of the first input line 305 as the third driving data Q_6 dB at a high level of the first clock RCK. Furthermore, during the first or second mode, the third data selection unit 340 may output the data DI<1> of the second input line 306 as the third driving data Q_6 dB at a high level of the second clock FCK. During the third mode, the third data selection unit 340 may output the inverted second delay data QDB<1> as the third driving data dB at a high level of the first clock RCK. Furthermore, during the third mode, the third data selection unit 340 may output the inverted first delay data QDB<0> as the third driving data Q_6 dB at a high level of the second clock FCK.

The first to third driving units 350 to 370 may drive the output line 307 in response to the respective first to third driving data Q, Q_3.5 dB, and Q_6 dB. In this case, the data OUT of the output line 307 may be output to the outside of a semiconductor device including the data transmission circuit through the output pad 308. Each of the first to third driving units 350 to 370 may perform pull-up driving on the output line 307 when corresponding driving data has a high level. The first to third driving units 350 to 370 may have different driving forces. In this case, the driving force of the first driving unit 350, that is, a main driving unit, may be greater than that of each of the second and third driving units 360 and 370, and the driving force of the second driving unit 360 may be greater than that of the third driving unit 370.

Each of the first to third driving units 350 to 370 may include one or more drivers DRV. When the drivers DRV have the same driving force, each of the first to third driving units 350 to 370 may include different numbers of the drivers DRV corresponding to its own driving force. For example, in order to implement the −15 dB data emphasis and the −6 dB data emphasis, the first driving unit 350 may include 9 drivers DRV (×9), the second driving unit 360 may include 2 drivers DRV (×2) and the third driving unit 370 may include a single driver DRV (×1).

In the data transmission circuit of FIG. 3, all the first to third driving data Q, Q_15 dB, and Q_6 dB for controlling the driving units 350 to 370 may have the same phase because they have been synchronized with the reference clock CK. Accordingly, there is no skew between the first to third driving data Q, Q_3.5 dB, and Q_6 dB. FIG. 3 exemplarily illustrates the drivers DRV pull-up driving through a power source voltage VDD while the drivers DRV may pull-down drive through a ground voltage VSS.

Figure 4:
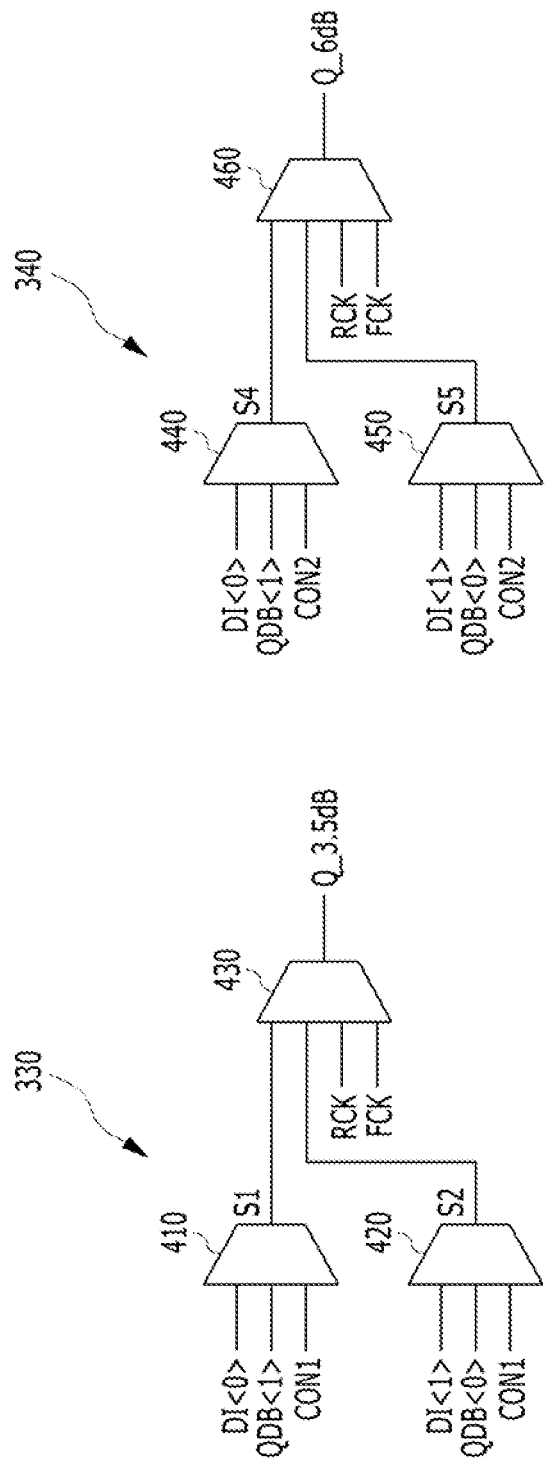
FIG. 4 is a block diagram illustrating second and third data selection units shown in FIG. 3.

FIG. 4 is a block diagram illustrating the second data selection unit 330 and the third data selection unit 340.

Referring to FIG. 4, the second data selection unit 330 may include first to third selection units 410 to 430, and the third data selection unit 340 may include fourth to sixth selection units 440 to 460.

During the first mode when the control signal CON1 has a low level, the first selection unit 410 may output the data DI<0> of the first input line 305 as selected data S1. During the second or third mode when the control signal CON1 has a high level, the first selection unit 410 may output the inverted second delay data QDB<1> as the selected data S1. During the first mode when the control signal CON1 has a low level the second selection unit 420 may output the data DI<1> of the second input, line 306 as selected data S2. During the second or third mode when the control signal CON1 has a high level, the second selection unit 420 may output the inverted first delay data QDB<0> as the selected data S2. At a high level of the first clock RCK or a high level of the reference clock CK, the third selection unit 430 may output the selected data S1 of the first selection unit 410 as the second driving data Q_3.5 dB. At a high level of the second clock FCK or at a low level of the reference clock CK, the third selection unit 430 may output the selected data S2 of the second selection unit 420 as the second driving data Q_3.5 dB.

During the first or second mode when the control signal CON2 has a low level, the fourth selection unit 440 may output the data DI<0> of the first input line 305 as selected data S4. During the third mode when the control signal CON2 has a high level, the fourth selection unit 440 may output the inverted second delay data QDB<1> as the selected data S4. During the first or second mode when the control signal CON2 has a low level, the fifth selection unit 450 may output the data DI<1> of the second input line 306 as selected data S5. During the third mode when the control signal CON2 has a high level, the fifth selection unit 450 may output the inverted first delay data QDB<0> as the selected data S5. At a high level of the first clock RCK, the sixth selection unit 460 may output the selected data S4 of the fourth selection unit 440 as the third driving data Q_6 dB. At a high level of the second clock FCK, the sixth selection unit 460 may output the selected data S5 of the fifth selection unit 450 as the third driving data Q_6 dB.

Both the second and third driving data Q_3.5 dB and Q_6 dB may have phases synchronized with the reference clock CK because the third and the sixth selection units 430 and 460 operate according to the first clock RCK and the second clock FCK synchronized with the reference clock CK.

Figure 5:
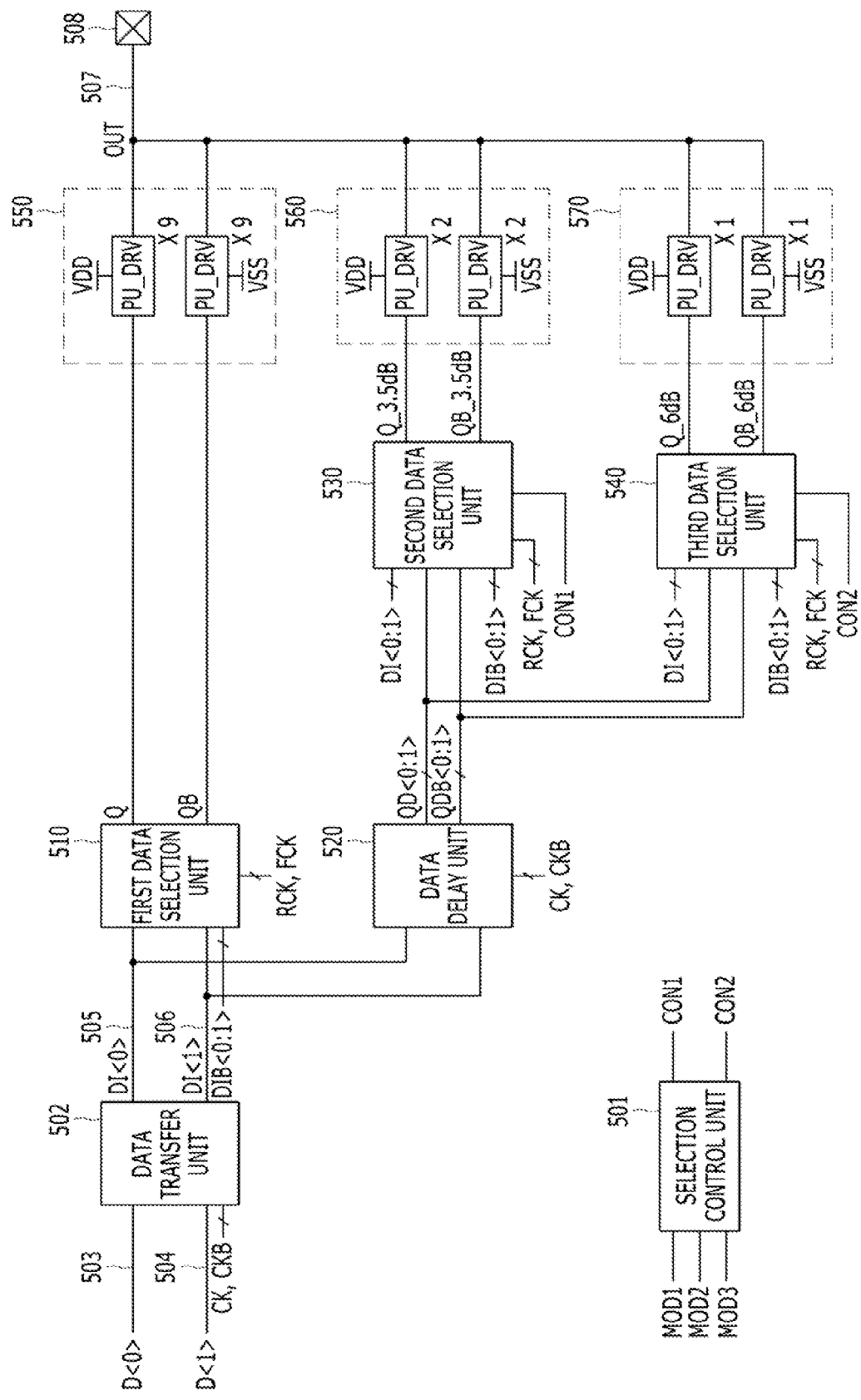
FIG. 5 is a block diagram illustrating a data transmission circuit in accordance with another embodiment of the present invention.

FIG. 5 is a block diagram illustrating a data transmission circuit in accordance with another embodiment of the present invention.

Referring to FIG. 5, the data transmission circuit may include a first data selection unit 510, a data delay unit 520, a second data selection unit 530, a third data selection unit 540, first to third driving units 550 to 570, a selection control unit 501, a data transfer unit 502, first and second internal data lines 503 and 504, first and second input lines 505 and 506, an output line 507, and an output pad 508.

The selection control unit 501, the data transfer unit 502, the first and second internal data lines 503 and 504, the first and second input lines 505 and 506, the output line 507 and the output pad 508 may be the same as the selection control unit 301, the data transfer unit 302, the first and second internal data lines 303 and 304, the first and second input lines 305 and 305, the output line 307, and the output pad 308 described with reference to FIG. 3.

The first data selection unit 510 may alternately output the data DI<0:1> of the first and second input lines 505 and 506 as first pull-up driving data Q. Furthermore, the first data selection unit 510 may alternately output inverted first and second data DIB<0:1> inverted from the data DI<0:1> of the first and second input lines 505 and 506 as first pull-down driving data QB.

At a high level of the first clock RCK, the first data selection unit 510 may output the data DI<0> of the first input line 505 as the first pull-up driving data Q and output the inverted first data DIB<0> as the first pull-down driving data QB. Furthermore, at a high level of the second clock FCK, the first data selection unit 510 may output the data DI<1> of the second input line 606 as the first pull-up driving data Q and output the inverted second data DIB<1> as the first pull-down driving data QB. The first data selection unit 510 may output the data DI<0> and DIB<0> as the respective driving data Q and QB at a high level of the reference clock CK and may output the data DI<1> and DIB<1> as the respective pull-up/pull-down data Q and QB at a low level of the reference clock CK. The operation of the first data selection unit 510 may be synchronized with the reference clock CK.

The data delay unit 520 may delay the data DI<0:1> of the first and second input lines 505 and 506 and output first and second delay data QD<0:1>. The data delay unit 520 may delay the data DI<0:1> for 1 UI and output the first and second delay data QD<0:1>. The data delay unit 520 may output inverted first and second delay data QDB<0:1> inverted from the first and second delay data QD<0:1>. The operation of the data delay unit 520 may be synchronized with the reference clock CK.

The second data selection unit 530 may alternately output the data DI<0:1> of the first and second input lines 505 and 506 as second pull-up driving data Q_3.5 dB during the first mode MOD1 when the control signal CON1 has a low level. Furthermore, the second data selection unit 530 may alternately output the inverted first and second data DIB<0:1> as second pull-down driving data QB_0.5 dB during the first mode MOD1 when the control signal CON1 has a low level. The second data selection unit 530 may alternately output the inverted first and second delay data QDB<0:1> as the second pull-up driving data Q_3.5 dB during the second or third mode when the control signal CON1 has a high level. Furthermore, the second data selection unit 530 may alternately output the first and second delay data QD<0:1> as the second pull-down driving data QB_3.5 dB during the second or third mode when the control signal CON1 has a high level. The operation of the second data selection unit 530 may be synchronized with the reference clock CK.

During the first mode, the second data selection unit 530 may output the data DI<0> and DIB<0> as the second pull-up driving data and pull-down driving data Q_3.5 dB and QB_3.5 dB at a high level of the first clock RCK, respectively. Furthermore, during the first mode, the second data selection unit 530 may output the data DI<1> and DIB<1> as the second pull-up driving data and pull-down driving data Q_3.5 dB and Q_3.5 dB at a high level of the second clock FCK, respectively. During the second mode or third mode, the second data selection unit 530 may output the data QDB<1> and QD<1> as the second pull-up driving data and pull-down driving data Q_3.5 dB and QB_3.5 dB at a high level of the first clock RCK, respectively. Furthermore, during the second or third mode, the second data selection unit 530 may output the data QDB<0> and QD<0> as the second pull-up driving data and pull-down driving data Q_3.5 dB and QB_3.5 dB at a high level of the second clock FCK, respectively.

The third data selection unit 540 may alternately output the data DI<0:1> of the first and second input lines 505 and 506 as third pull-up driving data Q_6 dB during the first or second mode when the control signal CON2 has a low level. Furthermore, the third data selection unit 540 may alternately output inverted first and second data DIB<0:1> as third pull-down driving data QB_6 dB during the first or second mode when the control signal CON2 has a low level. The third data selection unit 540 may alternately output the inverted first and second delay data QDB<0:1> as the third pull-up driving data Q_6 dB during the third mode when the control signal CON2 has a high level. Furthermore, the third data selection unit 540 may alternately output the first and second delay data QD<0:1> as the third pull-down driving data QB_6 dB during the third mode when the control signal CON2 has a high level. The operation of the third data selection unit 540 may be synchronized with the reference clock CK.

During the first or second mode, the third data selection unit 540 may output the data DI<0> and DIB<0> as the respective driving data Q_6 dB and QB_6 dB at a high level of the first clock RCK. Furthermore, the third data selection unit 540 may output the data DI<1> and DIB<1> as the respective driving data Q_6 dB and QB_6 dB at a high level of the second clock FCK. During the third mode, the third data selection unit 540 may output the data QDB<1> and QD<1> as the respective driving data dB and QB_6 dB at a high level of the first clock RCK. Furthermore, during the third mode, the third data selection unit 540 may output the data QDB<0> and QD<0> as the respective driving data Q_6 dB and QB_6 dB at a high level of the second clock FCK.

Each of the first to third driving units 550 to 570 may drive the output line 507 in response to corresponding pull-up/pull-down driving data of the first to third pull-up/pull-down driving data Q/QB, Q_3.5 dB/QB_3.5 dB, and Q_6 dB/QB_6 dB.

The first to third driving units 550 to 570 may perform pull-up driving on the output line 507 when corresponding pull-up driving data has high level data, and perform pull-down driving on the output line 507 when corresponding pull-down driving data has a high level. The first to third driving units 550 to 570 may have different driving forces. In this case, the driving force of the first driving unit 550, that is, a main driving unit, may be greater than that of each of the second and third driving units 560 and 570. The driving force of the second driving unit 560 may be greater than that of the third driving unit 570.

Each of the first to third driving units 550 to 570 may include one or more pull-up/pull-down drivers PU_DRV/PD_DRV. When the pull-up/pull-down drivers PU_DRV/PD_DRV have the same driving force, each of the first to third driving units 550 to 570 may include different numbers of the drivers DRV corresponding to its own driving force. For example, in order to implement the −3.5 dB data emphasis and the −6 dB data emphasis, the first driving unit 550 may include 9 pull-up/pull-down drivers PU_DRV/PD_DRV (×9), the second driving unit 560 may include 2 pull-up/pull-down drivers PU_DRV/PD_DRV (×2), and the third driving unit 570 may include a single pull-up/pull-down driver PU_DRV/PD_DRV (×1).

In the data transmission circuit of FIG. 5, all of the first to third pull-up/pull-down driving data Q/QB, Q_3.5 dB/QB_3.5 dB, and dB/QB_6 dB for controlling the driving units 550 to 570 may have the same phase because they have been synchronized with the reference clock CK. Accordingly, there is no skew between the first to third pull-up/pull-down driving data Q/QB, Q_3.5 dB/QB_3.5 dB, and Q_6 dB/QB_6 dB.

The −15 dB data emphasis and the −6 dB data emphasis may be implemented in the first to third modes as follows. The emphasis level LEVEL may be expressed by the equation "20×log [(un-emphasized level of data)/(emphasized level of the data)]". The ratio of the un-emphasized level and the emphasized level may be represented by a ratio of a driving force driving the un-emphasized level of the data on the output, line 507 and a driving force driving the emphasized level of the data on the output line 507.

During the first mode, the driving force driving the emphasized level of the data may correspond to the driving force (9+2+1) of 12 drivers, and the driving force driving the un-emphasized level of the data may correspond to the driving force (9+2+1) of 12 drivers. Accordingly, the emphasis level LEVEL of the fitfirst mode may be 0 dB (20×log [(12)/(12)]).

During the second mode, the driving force driving the emphasized level of the data may correspond to the driving force (9+2+1) of 12 drivers, and the driving force driving the un-emphasized level of the data may correspond to the driving force (9−2+1) of 8 drivers. Accordingly, the emphasis level LEVEL of the second mode may be about −3.5 dB (20×log [(8)/(12)]).

During the third mode, the driving force driving the emphasized level of the data may correspond to the driving force (9+2+1) of 12 drivers, and the driving force driving the un-emphasized level of the data may correspond to the driving force (9−2−1) of 6 drivers. Accordingly, the emphasis level LEVEL of the third mode may be about −6 dB (20×log [(6)/(12)]).

Figure 6:
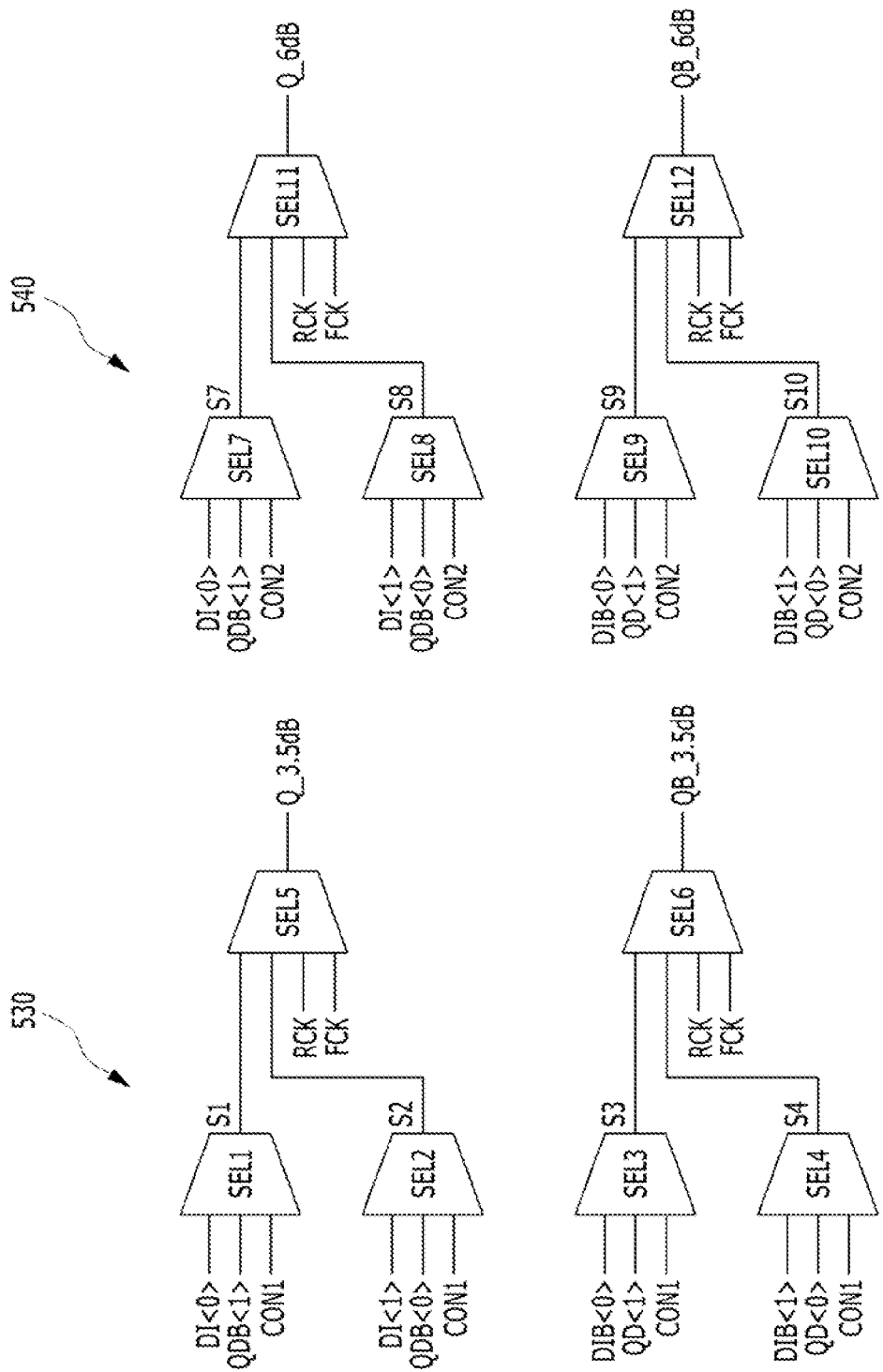
FIG. 6 is a block diagram illustrating second and third data selection units shown in FIG. 5.

FIG. 6 is a block diagram illustrating the second data selection unit 630 and the third data selection unit 640.

Referring to FIG. 6, the second data selection unit 630 may include first to sixth selection units SEL1 to SEL6, and the third data selection unit 640 may include seventh to twelfth selection units SEL7 to SEL12.

During the first mode when the control signal CON1 has a low level, the first selection unit SEL1 may output the data DI<0> of the first input line 505 as selected data S1. During the second or third mode when the control signal CON1 has a high level, the first selection unit SEL1 may output the inverted second delay data QDB<1> as the selected data S1. During the first mode when the control signal CON1 has a low level, the second selection unit SEL2 may output the data DI<1> of the second input line 506 as selected data S2. During the second or third mode when the control signal CON1 has a high level, the second selection unit SEL2 may output the inverted first delay data QDB<0> as the selected data S2. During the first mode when the control signal CON1 has a low level, the third selection unit SEL3 may output the inverted first data DIB<0> as selected data S3. During the second or third mode when the control signal CON1 has a high level, the third selection unit SEL3 may output the second delay data QD<1> as the selected data S3. During the first mode when the control signal CON1 has a low level, the fourth selection unit SEL4 may output the inverted second data DIB<1> as selected data S4. During the second or third mode when the control signal CON1 has a high level the fourth selection unit SEL4 may output the first delay data QD<0> as the selected data S4.

At a high level of the first clock RCK or a high level of the reference clock CK, the fifth selection unit SEL5 may output the selected data S1 as the second pull-up driving data Q_3.5 dB. At a high level of the second clock FCK or at a low level of the reference clock CK, the fifth selection unit SEL5 may output the selected data S2 as the second pull-up driving data Q_3.5 dB. At a high level of the first clock RCK, the sixth selection unit SEL6 may output the selected data S3 as the second pull-down driving data QB_3.5 dB. At a high level of the second clock FCK, the sixth selection unit SEL6 may output the selected data S4 as the second pull-down driving data QB_3.5 dB.

During the first or second mode when the control signal CON2 has a low level, the seventh selection unit SEL7 may output the data DI<0> as selected data S7. During the third mode when the control signal CON2 has a high level, the seventh selection unit SEL7 may output the inverted second delay data QDB<1> as the selected data S7. During the first or second mode when the control signal CON2 has a low level, the eighth selection unit SEL8 may output the data DI<1> as selected data S8. During the third mode when the control signal CON2 has a high level, the eighth selection unit SEL8 may output the inverted first delay data QDB<0> as the selected data S8. During the first or second mode when the control signal CON2 has a low level, the ninth selection unit SEL9 may output the inverted first data DIB<0> as selected data S9. During the third mode when the control signal CON2 has a high level, the ninth selection unit SEL9 may output the second delay data QD<1> as the selected data S9. During the first or second mode when the control signal CON2 has a low level, the tenth selection unit SEL10 may output the inverted second data DIB<1> as selected data S10. During the third mode when the control signal CON2 has a high level, the tenth selection unit SEL10 may select the first delay data QD<0> as the selected data S10.

At a high level of the first clock RCK or a high level of the reference clock CK, the eleventh selection unit SEL11 may output the selected data S7 as the third pull-up driving data Q_6 dB. At a high level of the second clock FCK or at a low level of the reference clock CK, the eleventh selection unit SEL11 may output the selected data S8 as the third pull-up driving data Q_6 dB. At a high level of the first clock RCK, the twelfth selection unit SEL12 may output the selected data S9 as the third pull-down driving data QB_6 dB. At a high level of the second clock FCK or at a low level of the reference clock CK, the twelfth selection unit SEL12 may output the selected data S10 as the third pull-down driving data QB_6 dB.

Both the second and third pull-up/pull-down driving data Q_3.5 dB/QB_3.5 dB and Q_6 dB/QB_6 dB may have phases synchronized with the reference clock CK because the fifth, the sixth, the eleventh, and the twelfth selection units SEL5, SEL6, SEL11, and SEL12 operate according to the first clock RCK and the second clock FCK synchronized with the reference clock CK.

Figure 7A:
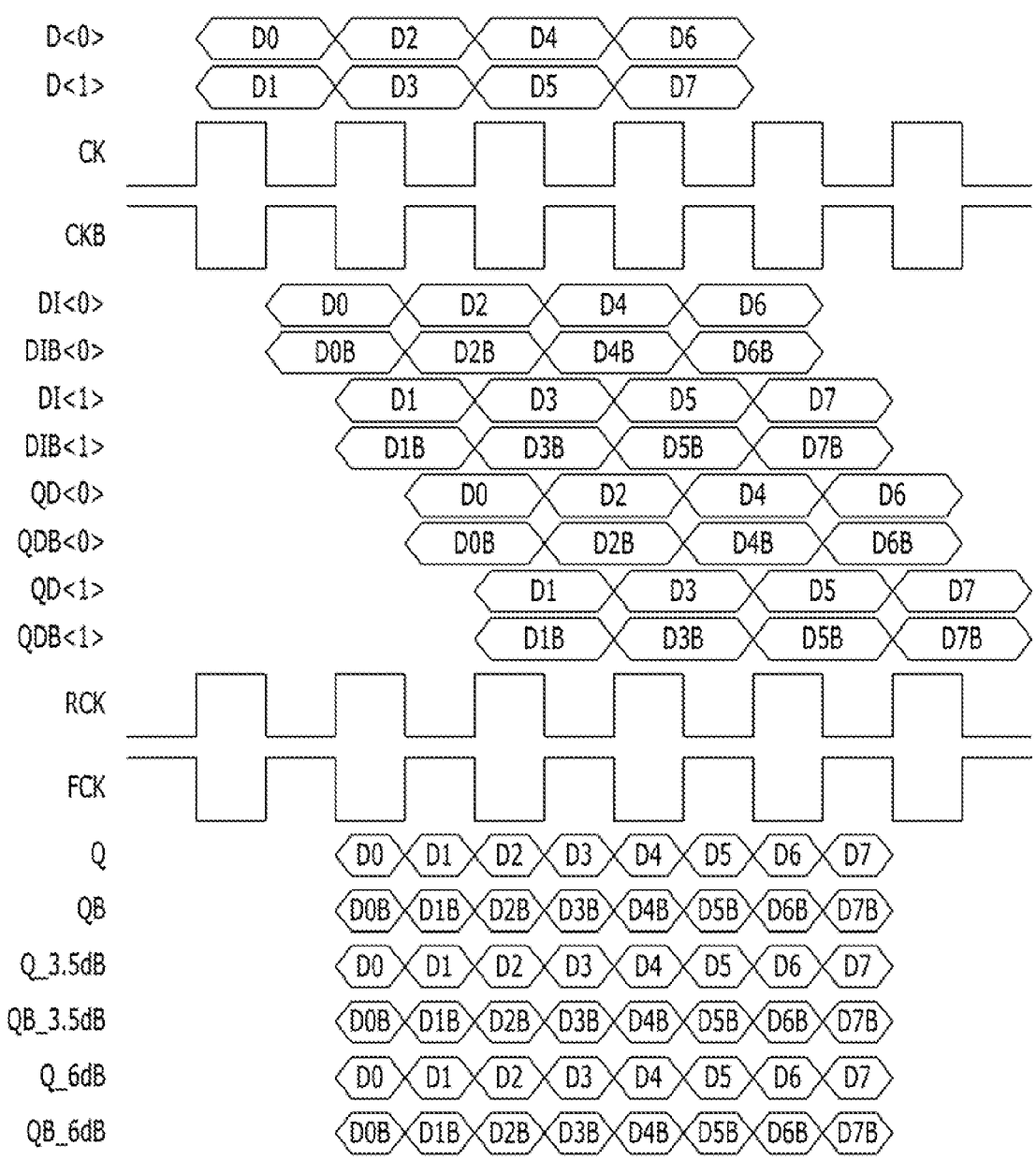
FIGS. 7A 7B, and 7C are waveforms illustrating operations of data transmission circuits shown in FIG. 5.
Figure 7B:
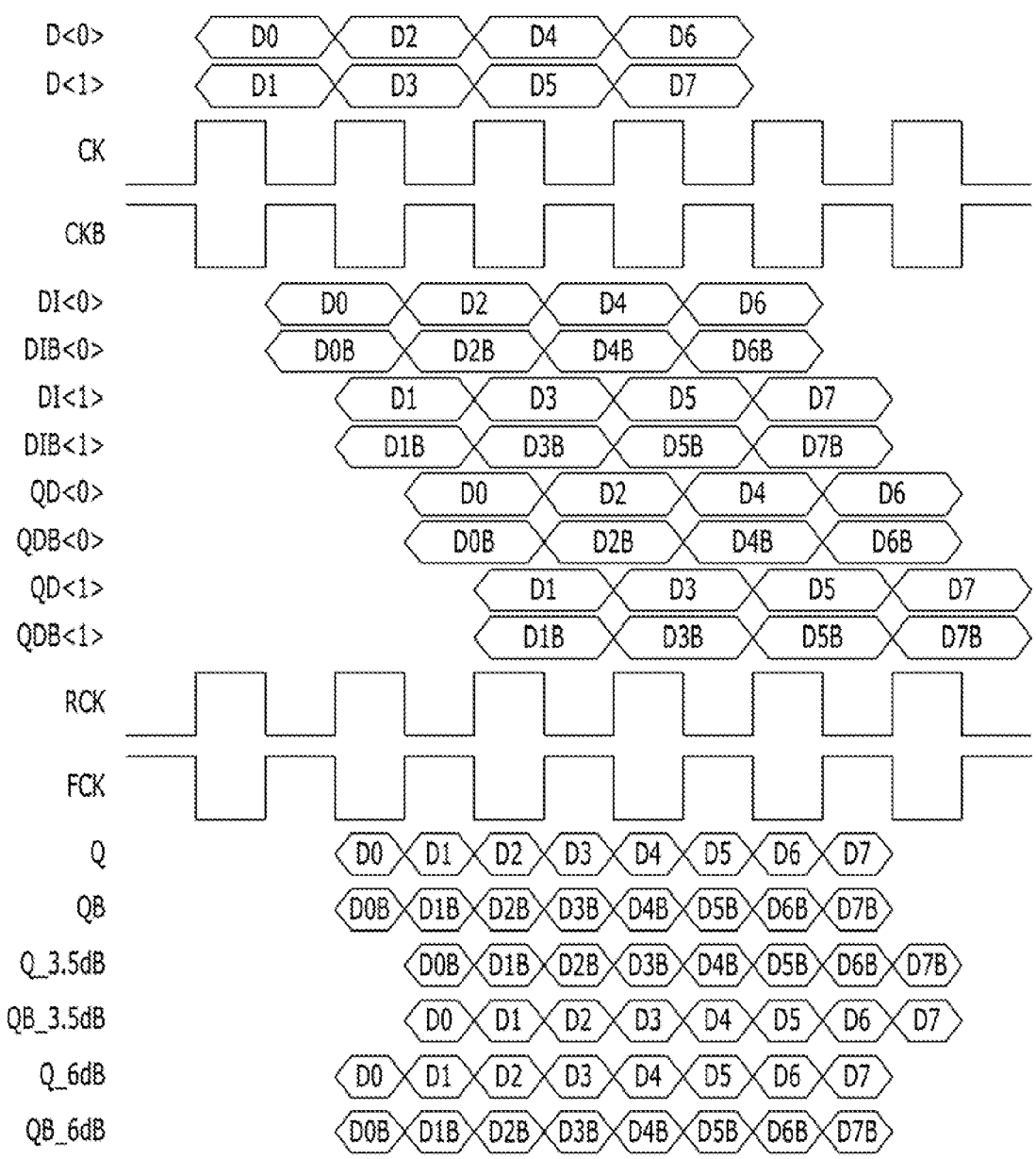
Figure 7C:
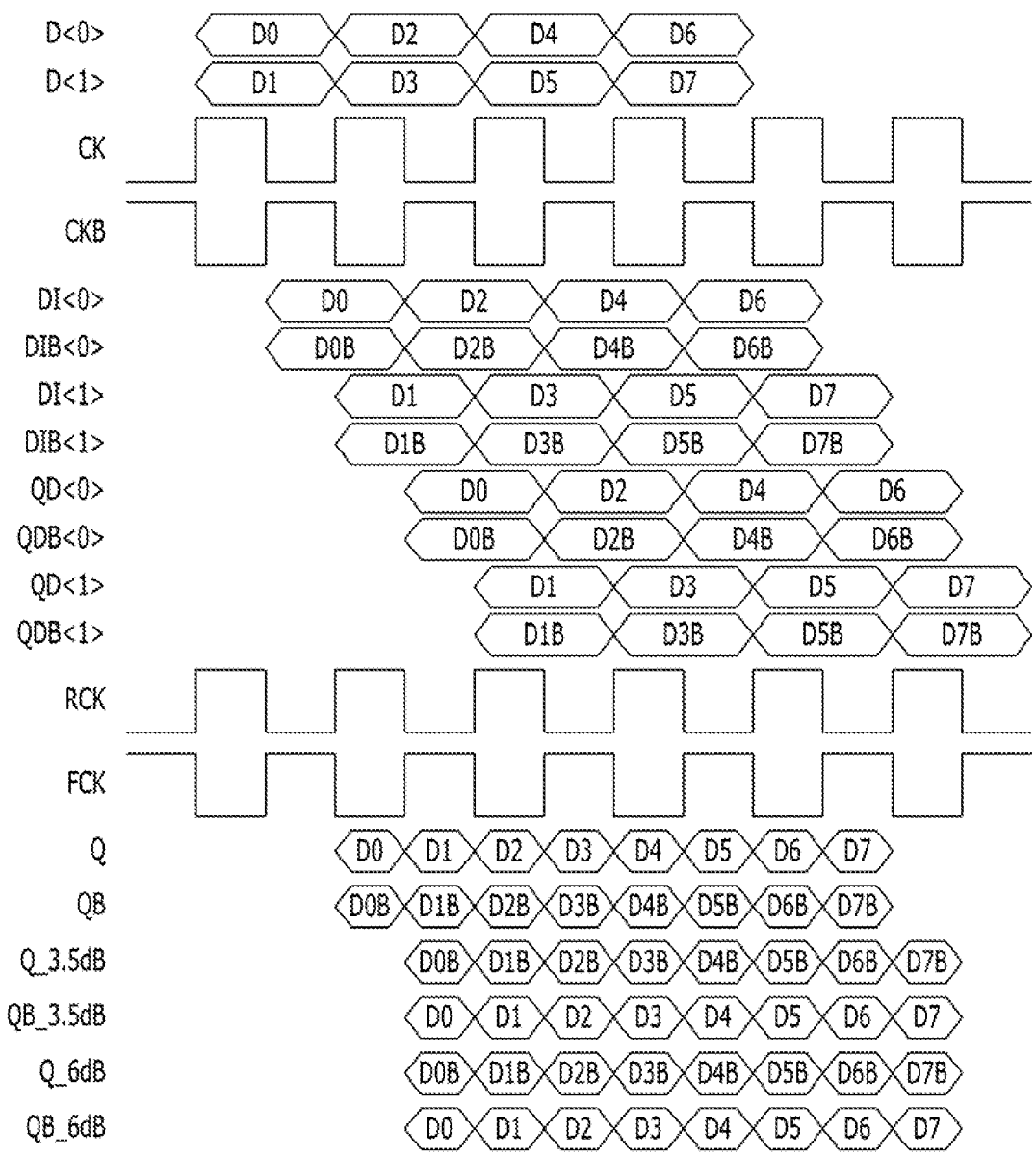

FIGS. 7A, 7B and 7C are waveforms illustrating operations of data transmission circuit shown in FIG. 5. FIGS. 7A to 7C illustrate operations in the first to third modes, respectively.

Referring to FIGS. 7A, 7B, and 7C, CK represents the reference clock. CKB represents a clock having a phase opposite to the phase of the reference clock CK. RCK represents the rising clock. FCK represents the falling clock. D<0> and 0<1> represent the data of the internal data lines 503 and 504. DI<0> and DI<1> represent the delayed data of the input lines 505 and 506. DIB<0> and DIB<1> represent the inverted first and second data. QD<0> and QD<1> represent the delay data. QDB<0> and QDB<1> represent the inverted first and second delay data. Q/QB respectively represent the first pull-up/pull-down driving data. Q_3.5 dB/QB_3.5 dB respectively represent the second pull-up/pull-down driving data. Q_6 dB/QB_6 dB respectively represent the third pull-up/pull-down driving data. DK represents $K^{th}$ data 0<0:1> of the internal data lines 503 and 504. DKB represents inverted data of the data DK. The operation of the data transmission circuit for transmission of data D0 to D7 is exemplarily described below.

Referring to FIGS. 7A, 7B, and 7C, the data D<0> may be sequentially input as data D0, D2, 04 and 06 and the data D<1> may be sequentially input as data D1, D3, D5, and D7. The data DI<0> has a phase that is half of a clock cycle delayed from the data D<0> and is sequentially transferred as the data D0, D2, D4, and D6. The data DI<1> has a phase of 1 clock delayed from the data D<1> and is sequentially transferred as the data D1, D3, D5, and D7. The inverted first data DIB<0> is sequentially transferred as the inverted data D0B, D2B, D4B, and D6B. The inverted second data DIB<1> is sequentially transferred as the inverted data D1B, D3B, D5B, and D7B. The first delay data QD<0> has a phase of 1 UI or clock delayed from the data DI<0>. The second delay data QD<1> has a phase of 1 UI or 1 clock delayed from the data DI<1>. The inverted first delay data QDB<0> is inverted from the first delay data QD<0>, and the inverted second delay data QDB<1> is inverted from the second delay data QD<1>.

The delayed first data and inverted first data DI<0> and DIB<0> are transferred as the first pull-up/pull-down driving data Q and QB at a high level of the first clock RCK. The delayed second data and inverted second data DI<1> and DIB<1> are transferred as the first pull-up/pull-down driving data Q and QB at a high level of the second clock FCK. Accordingly, the first pull-up driving data Q is sequentially transferred as the data D0 to D7, and the first pull-down driving data QB is sequentially transferred as the data D0B to D7B.

Referring to FIG. 7A illustrating the first mode, at a high level of the first clock RCK, the data DI<0> is transferred as the second and third pull-up driving data Q_3.5 dB/Q_6 dB and the inverted first data DIB<0> is transferred as the second pull-down driving data and third pull-up driving data QB_3.5 dB/Q_6 dB. When the second clock FCK has a high level, the data DI<1> is transferred as the second and third pull-up driving data Q_3.5 dB/Q_6 dB and the inverted second data DIB<1> is transferred as the second pull-down driving data and third pull-up driving data QB_3.5 dB/Q_6 dB. Accordingly, the first to third pull-up driving data Q, Q_3.5 dB, and Q_6 dB have the same phase and are sequentially transferred as the same data D0 to D7. Furthermore, the first to third pull-down driving data QB, QB_3.5 dB, and QB_6 dB have the same phase and are sequentially transferred as the same data D0B to D7B.

Referring to FIG. 7B illustrating the second mode, the inverted second delay data QDB<1> is transferred as the second pull-up driving data Q_3.5 dB at a high level of the first clock RCK, and the inverted second delay data QDB<1> is transferred as the second pull-up driving data Q_3.5 dB at a high level of the second clock FCK. Furthermore, the data DI<0> is transferred as the third pull-up driving data Q_6 dB at a high level of the first clock RCK, and the data DI<1> is transferred as the third pull-up driving data Q_6 dB at a high level of the second clock FCK. Accordingly, the second pull-up driving data Q_3.5 dB is 1 UI or half of a clock cycle delayed from the first pull-up driving data Q and has an opposite level to the first pull-up driving data Q. The third pull-up driving data Q_6 dB has the same phase and level as the first pull-up driving data Q. During the second mode, the second delay data QD<1> is transferred as the second pull-down driving data QB_3.5 dB at a high level of the first clock RCK, and the second delay data QD<1> is transferred as the second pull-down driving data QB_3.5 dB at a high level of the second clock FCK. Furthermore, the inverted first data DIB<0> is transferred as the third pull-down driving data QB_6 dB at a high level of the first clock RCK, and the inverted second data DIB<1> is transferred as the third pull-down driving data QB_6 dB at a high level of the second clock FCK. Accordingly, the second pull-down driving data QB_3.5 dB is 1 UI or half of a clock cycle delayed from the first pull-down driving data QB and has an opposite level to the first pull-up driving data Q. The third pull-down driving data QB_6 dB has the same phase and level as the first pull-down driving data QB.

Referring to FIG. 7C illustrating the third mode, the inverted second delay data QDB<1> is transferred as the second pull-up driving data Q_3.5 dB at a high level of the first clock RCK, and the inverted second delay data QDB<1> is transferred as the second pull-up driving data Q_3.5 dB at a high level of the second clock FCK. Furthermore, the inverted second delay data QDB<1> is transferred as the third pull-up driving data Q_6 dB at a high level of the first clock RCK, and the inverted second delay data QDB<1> is transferred as the third pull-up driving data Q_6 dB at a high level of the second clock FCK. Accordingly, the second and third pull-up driving data Q_3.5 dB and Q_6 dB are 1 UI or half of a clock cycle delayed from the first pull-up driving data Q and have opposite levels to the first pull-up driving data Q. During the third mode, the second delay data QD<1> is transferred as the second pull-down driving data QB_3.5 dB at a high level of the first clock RCK, and the second delay data QD<1> is transferred as the second pull-down driving data QB_3.5 dB at a high level of the second clock FCK. Furthermore, the second delay data QD<1> is transferred as the third pull-down driving data QB_ 6 dB at a high level of the first clock RCK, and the second delay data QD<1> is transferred as the third pull-down driving data QB_6 dB at a high level of the second clock FCK. Accordingly, the second and third pull-down driving data QB_3.5 dB and QB_6 dB are 1 UI or half of a clock cycle delayed from the first pull-up driving data Q, and have opposite levels to the first pull-down driving data QB.

Figure 8:
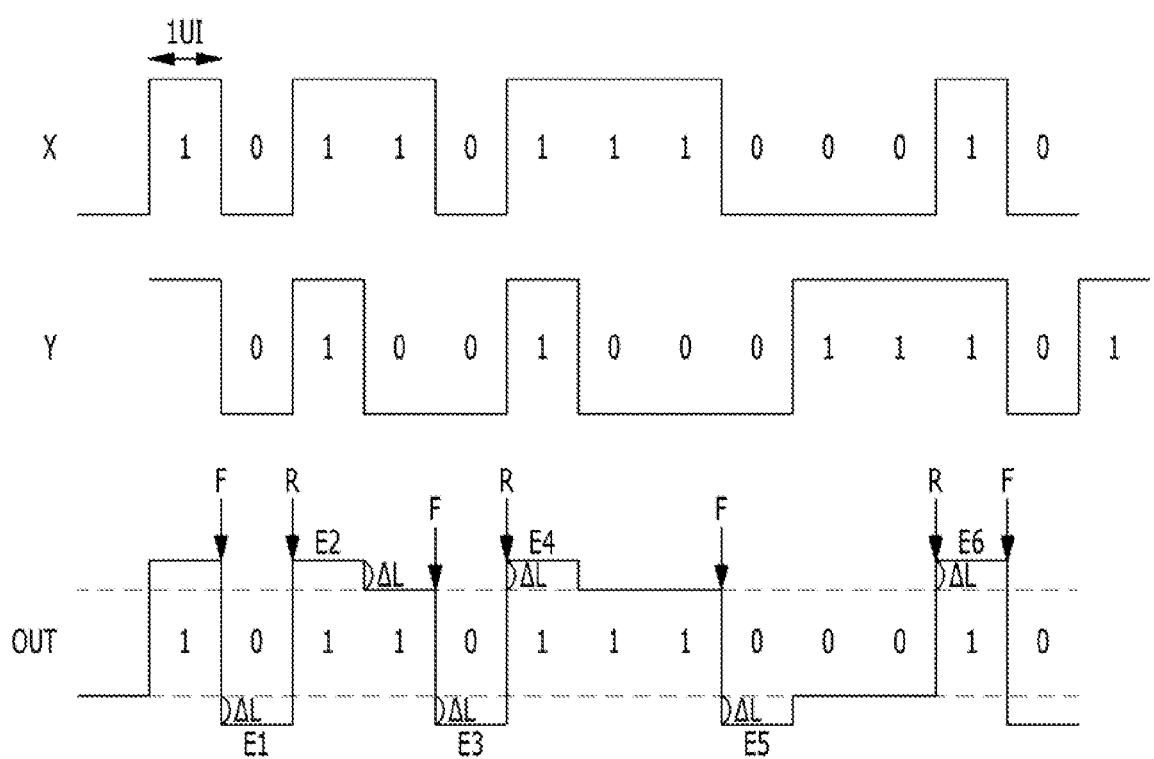
FIG. 8 is a waveform illustrating data output to an output pad shown in FIG. 5.

FIG. 8 is a waveform illustrating the data output to the output pad 508 shown in FIG. 5.

Referring to FIG. 8, "X" represents the waveform of data, which is not emphasized and output to the output pad 508. "Y" represents the waveform of the data delayed by an amount of 1 UI and inverted. "OUT" represents the waveform of data, which is emphasized and output to the output pad 508.

Example data "1011011100010" is sequentially output through the output pad 508. Without the data emphasis, all the data "1011011100010" become the same high level at "1" and become the same low level at "0". In this case, the waveform "Y" is 1 UI delayed from the waveform X, and it sequentially has inverted values "0100100011101."

During the data emphasis, the waveforms "X" and "Y" are combined and output as the waveform "OUT". Accordingly, through the data emphasis, the emphasized high level is higher than the un-emphasized high level and the emphasized low level is lower than the um-emphasized low level by an amount of "ΔL", as indicated by E1 to E6. That is, the waveform "OUT" is finally emphasized at rising and falling edges "R" and "F". The emphasized amount ΔL between the emphasized level and the un-emphasized level may depend on the second and third modes.

For reference, 1 UI in the data D<0:1>, DI<0:1>, QD<0:1>, and QDB<0:1> may be 1 clock based on the reference clock CK, and 1 UI in the pull-up/pull-down driving data Q/QB, Q_3.5 dB/QB_3.5 dB, and Q_6 dB/QB_6 dB may be half of a clock cycle based on the reference clock CK.

This technology can reduce skew between data combined for emphasis because all required data for the emphasis is generated in synchronization with a clock right before the stages of two drivers.

Although various embodiments have been described for illustrative purposes, it will be apparent to those skilled in the art that various changes and modifications may be made without departing from the spirit and scope of the invention as defined in the following claims.

What is claimed is:

1. A data transmission circuit, comprising:
   a first data selection unit suitable for alternately outputting data of first and second input lines as first driving data in synchronization with a clock;
   a data delay unit suitable for generating first and second delay data by delaying the data of the first and second input lines in synchronization with the clock;
   a second data selection unit suitable for:
   alternately outputting the data of the first and second input lines as second driving data in synchronization with the clock during a first mode, and alternately outputting inverted first and second delay data, which are inverted from the first and second delay data, as the second driving data in synchronization with the clock during a second mode;

a first driving unit suitable for driving an output line in response to the first driving data; and a second driving unit suitable for driving the output line response to the second driving data.

2. The data transmission circuit of claim 1, wherein the data delay unit generates the first and second delay data by delaying the data of the first and second input lines for a unit interval of the data of the first and second input lines.

3. The data transmission circuit of claim 2, wherein the unit interval is a cycle of the clock.

4. The data transmission circuit of claim herein the first data selection unit is suitable for:

outputting the data of the first input line as the first driving data at a first level of the clock, and outputting the data of the second input line as the first driving data at a second level of the clock.

5. The data transmission circuit of claim 4, wherein the second data selection unit is suitable for:

during the first mode, outputting the data of the first input line as the second driving data at the first level of the clock and outputting the data of the second input line as the second driving data at the second level of the clock, and during the second mode, outputting the inverted second delay data as the second driving data at the first level of the clock and outputting the inverted second delay data as the second driving data at the second level of the clock.

6. The data transmission circuit of claim 4, further comprising:

a third data selection unit suitable or:

during the first or second mode, alternately outputting the data of the first and second input lines as third driving data in synchronization with the clock, and during a third mode, alternately outputting the inverted first and second delay data as the third driving data in synchronization with the clock; and a third driving unit suitable for driving the output line in response to the third driving data.

7. The data transmission circuit of claim 6, wherein the third data selection unit is suitable for:

during the first or second mode, outputting the data of the first input line as the third driving data at the first level of the clock and outputting the data of the second input line as the third driving data at the second level of the clock, and during the third mode, outputting the inverted second delay data as the third driving data at the first level of the clock and outputting the inverted second delay data as the third driving data at the second level of the clock.

8. The data transmission circuit of claim 7, wherein:

during the third mode, the second data selection unit outputs the inverted second delay data as the second driving data at the first level of the clock, and outputs the inverted first delay data as the second driving data at the second level of the clock.

9. The data transmission circuit of claim 8, wherein the second data selection unit comprises:

a first selection unit suitable for outputting the data of the first input line during the first mode, and outputting the inverted second delay data during the second or third mode;

a second selection unit suitable for outputting the data of the second input line during the first mode, and outputting the inverted first delay data during the second or third mode; and a third selection unit suitable for outputting the output of the first selection unit as the second driving data at the first level of the clock, and outputting the output of the second selection unit as the second driving data at the second level of the clock.

10. The data transmission circuit of claim 8, wherein the third data selection unit comprises:

a fourth selection unit suitable for outputting the data of the first input line during the first or second mode, and outputting the inverted second delay data during the third mode;

a fifth selection unit suitable for outputting the data of the second input line during the first or second mode, and outputting the inverted first delay data during the third mode; and a sixth selection unit suitable for outputting the output of the fourth selection unit as the third driving data at the first level of the clock, and outputting the output of the fifth selection unit as the third driving data at the second level of the clock.

11. The data transmission circuit of claim 6, wherein:

the first driving unit has a greater driving force than the second driving unit, and the second driving unit has a greater driving force than the third driving unit.

12. The data transmission circuit of claim 11, wherein:

the first driving unit comprises N (N is a natural number) drivers, the second driving unit comprises M (M is a natural number smaller than N) drivers, and the third driving unit comprises L (L is a natural number smaller than M) drivers.

13. A data transmission circuit, comprising:

a first data selection unit suitable for:

alternately outputting data of first and second input lines as first pull-up driving data in synchronization with a clock, and alternately outputting inverted first and second data, which are inverted from the data of the first and second input lines, as first pull-down driving data in synchronization with the clock;

a data delay unit suitable for:

generating first and second delay data by delaying the data of the first and second input lines in synchronization with the clock, and generating inverted first and second delay data by inverting the first and second delay data in synchronization with the clock;

a second data selection unit suitable for:

during a first mode, alternately outputting the data of the first and second input lines as second pull-up driving data and alternately outputting the inverted first and second data as second pull-down driving data, in synchronization with the clock, and during a second mode, alternately outputting the inverted first and second delay data as the second pull-up driving data and alternately outputting the first and second delay data as the second pull-down driving data, in synchronization with the clock;

a first driving unit suitable for performing pull-up driving on an output line in response to the first pull-up driving data and performing pull-down driving on the output line in response to the second pull-down driving data; and a second driving unit suitable for performing pull-up driving on the output line in response to the second pull-up driving data and performing pull-down driving on the output line in response to the second pull-down driving data.

14. The data transmission circuit of claim 13, wherein the data delay unit generates the first and second delay data by delaying the data of the first and second input lines for a unit interval of the data of the first and second input lines.

15. The data transmission circuit of claim 14, wherein the unit interval is a cycle of the clock.

16. The data transmission circuit of claim 13, wherein the first data selection unit is suitable for:

outputting the data of the first input line as the first pull-up driving data at a first level of the clock, and outputting the data of the second input line as the first pull-up driving data at a second level of the clock, and outputting the inverted first data as the first pull-down driving data at the first level of the clock, and outputting the inverted second data as the first pull-down driving data at the second level of the clock.

17. The data transmission circuit of claim 16, wherein the second data selection unit is suitable for:

during the first mode, outputting the data of the first input line as the second pull-up driving data at the first level of the clock, outputting the data of the second input line as the second pull-up driving data at the second level of the clock, outputting the inverted first data as the second pull-down driving data at the first level of the clock, and outputting the inverted second data as the second pull-down driving data at the second level of the clock, and during the second mode, outputting the inverted second delay data as the second pull-up driving data at the first level of the clock, outputting the inverted first delay data as the second pull-up driving data at the second level of the clock, outputting the second delay data as the second pull-down driving data at the first level of the clock, and outputting the first delay data as the second pull-down driving data at the second level of the clock.

18. The data transmission circuit of claim 16, further comprising:

a third data selection unit suitable for:

during the first or second mode, alternately outputting the data of the first and second input lines s third pull-up driving data, alternately outputting the inverted first and second data as third pull-down driving data, in synchronization with the clock, and during a third mode, alternately outputting the inverted first and second delay data as the third pull-up driving data, and alternately outputting the first and second delay data as the third pull-down driving data, in synchronization with the clock; and a third driving unit suitable for performing pull-up driving on the output line in response to the third pull-up driving data and performing pull-down driving on the output line in response to the third pull-down driving data.

19. The data transmission circuit of claim 18, wherein the third data selection unit is suitable for:

during the first or second mode, outputting the data of the first input line as the second pull-up driving data at the first level of the clock, outputting the data of the second input line as the second pull-up driving data at the second level of the clock, outputting the inverted first data as the second pull-down driving data at the first level of the clock, outputting the inverted second data as the second pull-down driving data at the second level of the clock, and during the third mode, outputting the inverted second delay data as the third pull-up driving data at the first level of the clock, outputting the inverted first delay data as the third pull-up driving data at the second level of the clock, outputting the second delay data as the third pull-down driving data at the first level of the clock, and outputting the first delay data as the third pull-down driving data at the second level of the clock.

20. The data transmission circuit of claim 19, wherein:

during the third mode, the second data selection unit outputs the inverted second delay data as the second pull-up driving data at the first level of the clock, outputs the inverted first delay data as the second pull-up driving data at the second level of the clock, outputs the second delay data as the second pull-down driving data at the first level of the clock, and outputs the first delay data as the second pull-down driving data at the second level of the clock.

21. The data transmission circuit of claim 20, wherein the second data selection unit comprises:

a first selection unit suitable for outputting the data of the first input line during the first mode, and outputting the inverted second delay data during the second or third mode;

a second selection unit suitable for outputting the data of the second input line during the first mode, and outputting the inverted first delay data during the second or third mode;

a third selection unit suitable for outputting the inverted first data during the first mode, and outputting the second delay data during the second or third mode;

a fourth selection unit suitable for outputting the inverted second data during the first mode, and outputting the first delay data during the second or third mode;

a fifth selection unit suitable for outputting the output of the first selection unit as the second pull-up driving data at the first level of the clock, and outputting the output of the second selection unit as the second pull-up driving data at the second level of the clock; and a sixth selection unit suitable for outputting the output of the third selection unit as the second pull-down driving data at the first level of the clock, and outputting the output of the fourth selection unit as the second pull-down driving data at the second level of the clock.

22. The data transmission circuit of claim 20, wherein the third data selection unit comprises:

a seventh selection unit suitable for outputting the data of the first input line during the first or second mode, and outputting the inverted second delay data during the third mode;

an eighth selection unit suitable for outputting the data of the second input line during the first or second mode, and outputting the inverted first delay data during the third mode;

a ninth selection unit suitable for outputting the first inversion data during the first or second mode, and outputting the second delay data during the third mode;

a tenth selection unit suitable for outputting the inverted second data during the first or second mode, and outputting the first delay data during the third mode;

an eleventh selection unit suitable for outputting the output of the seventh selection unit as the third pull-up driving data at the first level of the clock, and outputting the output of the eighth selection unit as the third pull-up driving data at the second level of the clock; and a twelfth selection unit suitable for outputting the output of the ninth selection unit as the third pull-down driving data at the first level of the clock, and outputting the output of the tenth selection unit as the third pull-down driving data at the second level of the clock.

23. The data transmission circuit of claim 18, wherein:

the first driving unit has a greater driving force than the second driving unit, and to the second driving unit has a greater driving force than the third driving unit.

24. The data transmission circuit of claim 23, wherein:

the first driving unit comprises N (N is a natural number) pull-up pull-down drivers, the second driving unit comprises M (M is a natural number smaller than N) pull-up/pull-down drivers, and the third driving unit comprises L (L is a natural number smaller than M) pull-up/pull-down drivers.

* * * * *